United States Patent
Breems et al.

(10) Patent No.: US 11,658,677 B2
(45) Date of Patent: May 23, 2023

(54) SYSTEM AND METHOD OF REPLICATING AND CANCELLING CHOPPING FOLDING ERROR IN DELTA-SIGMA MODULATORS

(71) Applicant: NXP B.V., Endhoven (NL)

(72) Inventors: Lucien Johannes Breems, Waalre (NL); Marcello Ganzerli, Eindhoven (NL); Chenming Zhang, Eindhoven (NL); Pierluigi Cenci, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/490,415

(22) Filed: Sep. 30, 2021

(65) Prior Publication Data
US 2023/0102232 A1 Mar. 30, 2023

(51) Int. Cl.
*H03M 3/00* (2006.01)
*H03M 1/06* (2006.01)
*H03M 1/08* (2006.01)

(52) U.S. Cl.
CPC ............ *H03M 3/34* (2013.01); *H03M 1/0626* (2013.01); *H03M 1/0854* (2013.01); *H03M 3/32* (2013.01); *H03M 3/364* (2013.01); *H03M 3/38* (2013.01)

(58) Field of Classification Search
CPC ........ H03M 3/34; H03M 1/12; H03M 1/1245; H03M 3/458; H03M 3/464; H03M 1/1009; H03M 3/456; H03M 1/0607; H03M 1/0626; H03M 1/0639; H03M 1/0663; H03M 3/356; H03M 3/30
USPC .................. 341/118–120, 143, 155
See application file for complete search history.

(56) References Cited

U.S. PATENT DOCUMENTS

| | | | | |
|---|---|---|---|---|
| 5,675,334 A * | 10/1997 | McCartney | ............. | H03M 3/34 341/118 |
| 6,147,633 A * | 11/2000 | Ukawa | .................. | H03M 3/356 341/131 |
| 7,250,886 B1 * | 7/2007 | Killat | ................. | H03K 17/0416 341/150 |
| 7,511,652 B1 * | 3/2009 | Liu | ..................... | H03M 1/1019 341/120 |
| 9,685,967 B1 * | 6/2017 | Motz | ...................... | H03M 3/34 |

(Continued)

OTHER PUBLICATIONS

Billa, Sujith et al. "Analysis and Design of Continuous-Time Delta-Sigma Converters Incorporating Chopping." *IEEE Journal of Solid-State Circuits*, vol. 52, No. 9. Sep. 2017. pp. 2350-2361.

(Continued)

*Primary Examiner* — Linh V Nguyen (57) ABSTRACT

A system and method of replicating and cancelling chopping folding error in delta-sigma modulators. The modulator may include a loop filter coupled to a quantizer providing a digital signal, chopper circuitry that chops analog signals of the loop filter at a chopping frequency, and chopping folding error cancellation circuitry that replicates and cancels a chopping folding error of the chopper circuitry to provide a corrected digital signal. A digital chopper or multiplier chops the digital signal to provide a chopped digital signal, and the chopped digital signal is either amplified or multiplied by a gain value or digitally filtered to replicate the chopping folding error, which is then subtracted from the digital signal for correction. The timing and duty cycle of the chopping frequency may be adjusted. Timing and duty cycle adjustment may be calibrated along with the filtering.

20 Claims, 6 Drawing Sheets (56) References Cited

U.S. PATENT DOCUMENTS

| | | | | |
|---|---|---|---|---|
| 9,859,907 B1* | 1/2018 | Li | ............ | H03M 1/0678 |
| 10,797,715 B2* | 10/2020 | Straeussnigg | ....... | H03M 1/0626 |
| 2005/0156769 A1* | 7/2005 | O'Dowd | ............ | H03M 3/34 |
| | | | | 341/143 |
| 2009/0140900 A1* | 6/2009 | Pun | ............ | H03M 3/34 |
| | | | | 330/7 |
| 2011/0063146 A1* | 3/2011 | Matthews | ............ | H03M 3/34 |
| | | | | 341/118 |
| 2012/0146819 A1* | 6/2012 | Silva | ............ | G01R 19/02 |
| | | | | 341/110 |
| 2019/0305791 A1* | 10/2019 | Ali | ............ | H03M 1/0639 |

OTHER PUBLICATIONS

Jiang, Hui et al. "Chopping in Continuous-Time Sigma-Delta Modulators." In Conference Proceedings—IEEE International Symposium on Circuits and Systems, ISCAS 2017. pp. 1-4. IEEE. https://doi.org/10.1109/iscas.2017.8050951.

Leger, G., "On Chopper Effects in Discrete-Time ΣΔ Modulators", IEEE Transactions on Circuits and Systems 1: Regular Papers, IEEE, vol. 57, No. 9, Sep. 1, 2010.

Singh, K. "Analysis and Modeling of Chopping Phase Non-Overlap in Continuous-Time ΣΔ Modulators", IEEE Transactions on Circuits and Systems-I: Regular Papers. vol. 65, No. 10, Oct. 2018.

* cited by examiner

SYSTEM AND METHOD OF REPLICATING AND CANCELLING CHOPPING FOLDING ERROR IN DELTA-SIGMA MODULATORS

BACKGROUND

Field of the Invention

The present invention relates in general to delta-sigma converters, and more particularly to a system and method of replicating and cancelling chopping folding errors in delta-sigma converters.

Description of the Related Art

Delta-sigma (ΔΣ) modulators, including ΔΣ analog-to-digital converters (ADCs), are an important class of data converters that are widely used in the domain of low-to-medium bandwidth and medium-to-high resolution applications, such as, for example, audio codecs, receiver front-ends for mobile applications, narrow-band and wideband automotive radio receivers using amplitude modulation (AM), frequency modulation (FM), or digital audio broadcasting (DAB), and Frequency Modulated Continuous Wave (FMCW) radar front-ends. Many of these applications require an ADC with very low noise density and very high spectral purity throughout the entire signal band and under any signal condition. Depending on the application and architectural choices, the bandwidth requirements for the ADC can vary over orders of magnitude from very small (e.g., 20 kilohertz (kHz) for an audio codec) to fairly large (e.g., 110 megahertz (MHz) for a mixer-less wideband FM radio front-end) while noise density, linearity and spurious-free-dynamic-range (SFDR) are similar.

To realize the high bandwidth and resolution requirements, ΔΣ modulators are clocked at increasingly higher rates, approaching the gigahertz (GHz) range, taking benefit from the speed capabilities of advanced technology fabrication methods. As the feature sizes scale down with newer technologies, the flicker noise (or 1/f noise, in which "f" denotes frequency) contribution of small devices is increasingly dominating thermal noise.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

One known way of reducing 1/f noise is to increase the device dimensions, but this is at the cost of the speed capability of the transistor and usually is not a feasible solution in high-speed converters. Another known technique to mitigate 1/f noise is to employ chopping of the 1/f noise critical part of the amplifier, upconverting the 1/f noise spectral content to frequencies outside the signal band of interest, and creating frequency separation between the signal band and the (dominant part of the) 1/f noise band. There are a few important challenges of employing chopping in high-speed ΔΣ modulators including ΔΣ ADCs. As the application bandwidth can be high (e.g., 110 MHz in the FM radio example), the chopping frequency has to be high as well. When chopping at higher rates, the chopper becomes more prone to non-idealities like duty cycle error, time skew, etc. As a result, spectral content, such as out-of-band interferers and high-frequency quantization noise, that is present at the chopping frequency or multiples thereof, can be partly downfolded in the signal band thereby degrading modulator noise, spectral purity, and interference robustness. In particular, the downfolding of quantization noise is problematic since the out-of-band quantization noise of a ΔΣ modulator is very high.

In conventional configurations, the problem of quantization noise downfolding caused by chopping has been addressed by employing Finite Impulse Response digital to analog converters (FIRDACs) or return-to-zero (RTZ) switching. These techniques are generally effective for narrowband (highly oversampled) and low-frequency modulators, such as used in audio applications. A FIRDAC can suppress the quantization noise at specific frequencies, depending on the order of the filter. Deep suppression of the quantization noise is only achieved, however, in a very narrow band, which is insufficient for wideband applications. With RTZ switching, the chopper is only switching in the zero state of the DAC, which works well in lower sampling rate modulators, but is generally not applicable in GHz ADCs due to the very high switching rate of the DAC. Alternatively, the chopping frequency can be chosen to be equal to the sampling rate of the modulator. At multiples of the sampling frequency, the modulator quantization noise is suppressed similar as in the signal band. Therefore, even in the presence of large chopper non-idealities, the effect of noise downfolding is negligible. The main drawback of chopping at such a high (GHz) rate is that the chopping becomes less effective due to imprecise duty cycle of the chopping clock. Moreover, the implementation of a GHz chopper inside an amplifier is extremely challenging and can severely degrade the amplifier performance, making it impractical or even infeasible.

A system and method of replicating and cancelling chopping folding error in delta-sigma ($\Delta\Sigma$) modulators as described herein mitigates the quantization noise downfolding in a chopping modulator due to non-ideal chopping effects by means of digital post cancellation. A replica of the folding error introduced by analog chopping at a chopping frequency is extracted from the redundant information in the output of the modulator and subsequently subtracted from the output to suppress the in-band downfolded noise, spurs and interferers due to non-ideal chopping artefacts caused by analog chopping inside the modulator. The output is applied to a digital chopper operating at the chopping frequency and the chopped result is then applied to an amplifier with a selected gain error or to a filter that is programmed to model frequency dependent errors injected by modulator chopping.

Figure 1:
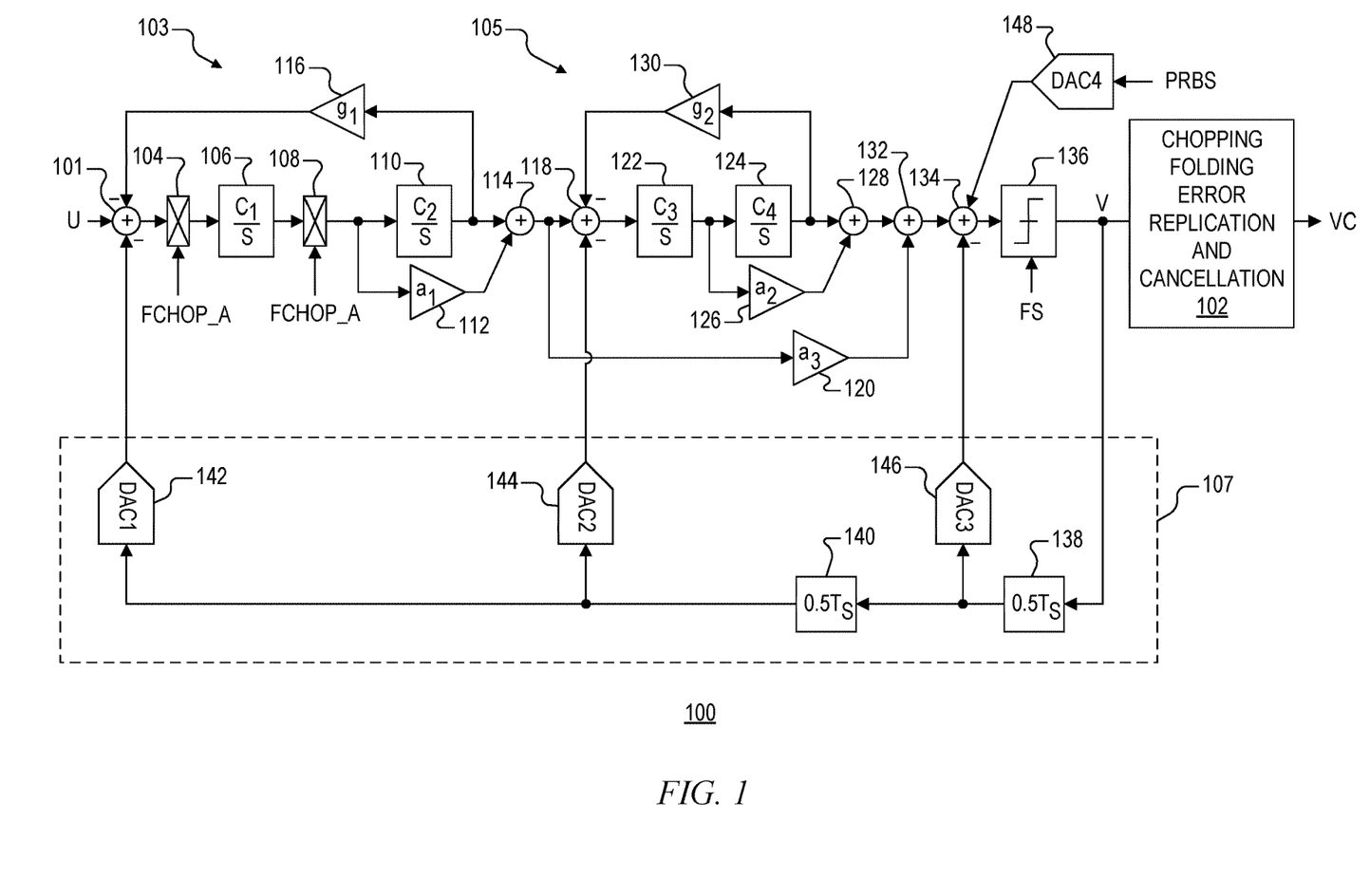
FIG. 1 is a simplified block diagram of a chopped continuous-time delta-sigma (ΔΣ) modulator configured as a ΔΣ analog-to-digital converter (ADC) including chopping folding error replication and cancellation circuitry implemented according to an embodiment of the present disclosure.

FIG. 1 is a simplified block diagram of a chopped continuous-time delta-sigma ($\Delta\Sigma$) modulator 100 configured as a $\Delta\Sigma$ analog-to-digital converter (ADC) and chopping folding error replication and cancellation circuitry 102 implemented according to an embodiment of the present disclosure. The illustrated $\Delta\Sigma$ modulator 100 includes 2 loop filters 103 and 105, a quantizer (a.k.a. comparator or digitizer) 136 clocked at a sampling frequency FS, a global negative feedback loop 107, along with various other supporting circuitry as described herein for converting an input analog signal U to an output digital signal V provided at an output of the quantizer 136. The 2 loop filters 103 and 105 are each configured as biquad filters, although alternative loop filter configurations are contemplated. The loop filter 103 includes a first integrator 106 with a transfer function of $c_1/s$, a second integrator 110 with a transfer function of $c_2/s$, a first path 112 with a gain of $a_1$, and a second path 116 with a gain of $g_1$. Two analog choppers 104 and 108 are coupled in the signal path of the loop filter 103 as further described herein. The loop filter 105 includes a third integrator 122 with a transfer function of $c_3/s$, a fourth integrator 124 with a transfer function of $c_4/s$, a third path 126 with a gain of $a_2$, and a second path 130 with a gain of $g_2$. The quantizer 136 may be configured as a 1-bit comparator, although quantizers with additional bits are contemplated. The global negative feedback loop 107 includes a pair of delay blocks 138 and 140 and three digital-to-analog converters (DACs) 142, 144, and 146. Each of the delay blocks 138 and 140 insert a delay of 0.5 TS in which TS is a period of the sampling frequency FS.

In the particular illustrated configuration, the analog input signal U is provided to a positive input of an adder 101, having an output provided to an input of the first analog chopper 104. The first analog chopper 104 has an output coupled to an input of the integrator 106, which has an output coupled an input of the second analog chopper 108.

The analog choppers 104 and 108 each receive an analog chop clock signal FCHOP_A having a selected chopping frequency. The second analog chopper 108 has an output coupled to an input of the second integrator 110 and to an input of the path 112. The second integrator 110 has an output coupled to one input of an adder 114 and to an input of the path 116, which has an output coupled to a negative input of the adder 101. The path 112 has an output coupled to another input of the adder 114, which has an output coupled to one input of an adder 118 and to an input of a feedforward path 120 having a gain of $a_3$. The adder 118 has an output coupled to an input of the third integrator 122, which has an output coupled to an input of the fourth integrator 124 and to an input of the path 126. The fourth integrator 124 has an output coupled to an input of the adder 128 and to an input of the path 130. The path 130 has an output coupled to a negative input of the adder 118 and the path 126 has an output coupled to another input of the adder 128. The outputs of the adder 128 and the path 120 are coupled to respective inputs of an adder 132, having an output coupled to an input of another adder 134. The adder 134 has an output coupled to an input of the quantizer 136, which has an output providing the digital signal V. V is fed back to an input of the first delay block 138, having its output coupled to an input of the DAC 146 and to an input of the second delay block 140. The output of the delay block 140 is coupled to the inputs of the DACs 142 and 144. The DAC 142 has an output coupled to a negative input of the adder 101, the DAC 144 has an output coupled to a negative input of the adder 118, and the DAC 146 has an output coupled to a negative input of the adder 134.

A pseudo-random bitstream sequencer (PRBS) signal is provided to an input of another DAC 148, which has an output coupled to another input of the adder 134. In this manner, PRBS is injected as a dither signal to mitigate the tonal behavior of the $\Delta\Sigma$ modulator 100. It is noted that the particular $\Delta\Sigma$ modulator 100 illustrated in FIG. 1 is exemplary only in which chopping folding error replication and cancellation may be provided to other types of ADCs and modulators employing chopping. The $\Delta\Sigma$ modulator 100 may be configured to operate in the MHz range bandwidth or higher which often means that the components used to fabricate a physical device are getting smaller to achieve the desired frequency of operation. The smaller devices, including the transistor devices, often suffer from flicker noise which is a type of electronic noise with 1/f power spectral density that can exceed any thermal noise contribution. The loop filter 103 at the input stage contributes dominantly to the flicker noise, so that the two analog choppers 104 and 108 are incorporated within the loop filter 103 to mitigate the flicker noise contribution. The analog choppers 104 and 108 are shown positioned at the input and the output of the first integrator 106, respectively although the choppers may actually be positioned within the first integrator 106 as further described herein.

In general, the V signal exhibits chopping folding errors caused by chopping by the analog choppers 104 and 108 within the loop filter 103. Thus, in some embodiments, the V signal is provided to an input of the chopping folding error replication and cancellation circuitry 102, which reduces or otherwise eliminates the chopping folding error as further described herein for providing a corrected output digital signal VC.

Figure 10:
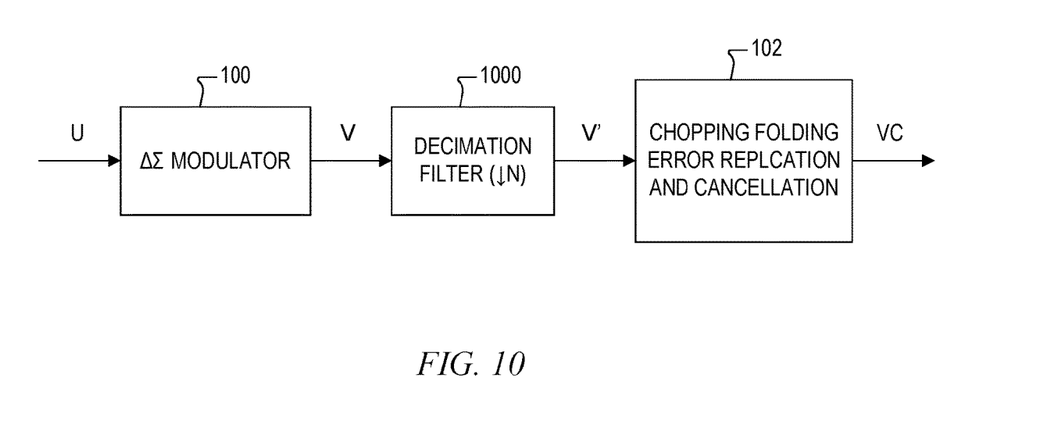
FIG. 10 is simplified block diagram of an alternative embodiment that may be applied to each of the embodiments of the chopping folding error replication and cancellation circuitry of FIG. 1 described herein.

FIG. 10 is simplified block diagram of an alternative embodiment that may be applied to each of the embodiments of the chopping folding error replication and cancellation circuitry 102 described herein. The V signal at the output of the ΔΣ modulator 100 may be further processed by a digital decimation filter 1000 in order to remove out-of-band quantization noise and to convert the high-rate low-resolution modulator output to a low-rate high-resolution signal. The V signal is filtered and decimated (by a factor of N) by the digital decimation filter 1000 to provide an alternative output V', which is instead provided to the input of the chopping folding error replication and cancellation circuitry 102 providing VC at its output. Since the analog chopping operation causes folding of the quantization noise at multiples of the chopping frequency FCHOP_A, when FCHOP_A is lower than FS/4 the folding error replication and cancellation may be performed on a filtered and decimated modulator output. More specifically, if the chopper in the analog domain is operated at FS/N, the digital chopping folding error replication and cancellation can be done on the modulator output after filtering and decimation by a factor smaller than N/2. This is assuming that the folded noise and spur from the frequency band(s) that suppressed by the decimation filter is not important. The implementation of digital chopping folding error replication and cancellation on a filtered and decimated modulator output can be more power and area efficient because of the lower rate of the decimated modulator output to be processed. Each of the embodiments described herein of the chopping folding error replication and cancellation circuitry 102 may receive either output signal V or V' depending upon the particular implementation.

Figure 2:
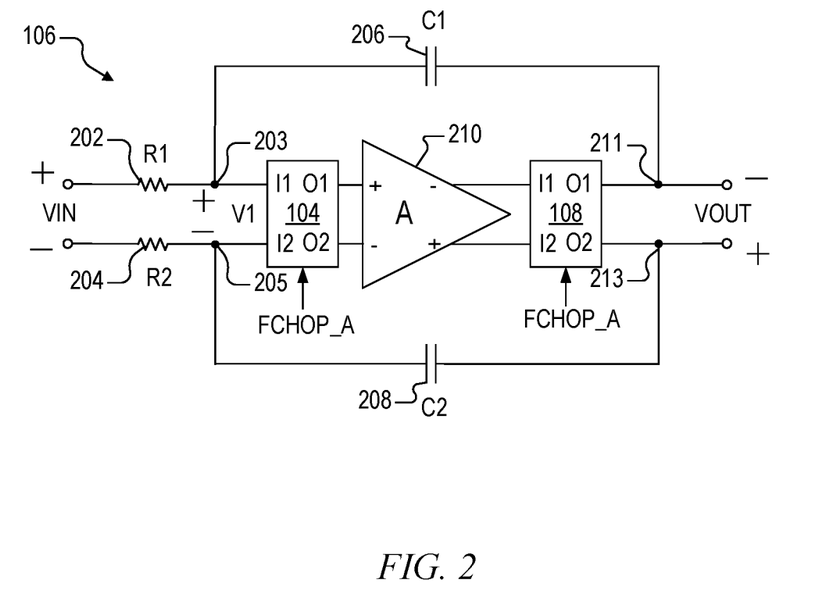
FIG. 2 is a schematic diagram of the integrator of FIG. 1 implemented according to one embodiment of the present disclosure.

FIG. 2 is a schematic diagram of the integrator 106 coupled to the analog choppers 104 and 108 implemented according to one embodiment of the present disclosure. An input signal VIN, such as received from the output of the adder 101, includes a positive polarity provided to a first end of a resistor 202 with a resistance R1 and includes a negative polarity provided to a first end of another resistor 204 with a resistance R2. The other end of the resistor 202 is coupled to a node 203 which is further coupled to a first input I1 of the analog chopper 104 and to one end of a capacitor 206 with a capacitance C1. The other end of the resistor 204 is coupled to a node 205 which is further coupled to a second input I2 of the analog chopper 104 and to one end of a capacitor 208 with a capacitance C2. The nodes 203 and 205 form the positive and negative polarities of a voltage V1. The analog chopper 104 has first and second outputs O1 and O2 coupled to noninverting and inverting inputs, respectively, of an amplifier 210. The amplifier 210 has inverting and noninverting outputs coupled to first and second inputs I1 and I2, respectively, of the analog chopper 108. The analog chopper 108 has a first output O1 coupled to an output node 211 forming a negative polarity of an output voltage VOUT, in which node 211 is further coupled to the other end of the capacitor 206. The analog chopper 108 has a second output O2 coupled to another output node 213 forming a positive polarity of VOUT, in which node 213 is further coupled to the other end of the capacitor 208. The polarities of VOUT are provided to corresponding polarity inputs (not shown) of the second integrator 110.

The configuration of the integrator 106 coupled to the analog choppers 104 and 108 shown in FIG. 2 is exemplary only and many different integrator configurations are possible and contemplated. In one embodiment, R1=R2 and C1=C2, although different values may be used in alternative configurations. Normally without the analog choppers 104 and 108, node 203 is coupled to the noninverting input and node 205 is coupled to the inverting input of the amplifier 210, while the inverting and noninverting outputs of the amplifier 210 are provided to output nodes 211 and 213, respectively. Each of the analog choppers 104 and 108 swaps its inputs and outputs at the rate of the chopping frequency of FCHOP_A as further described herein.

Figure 3:
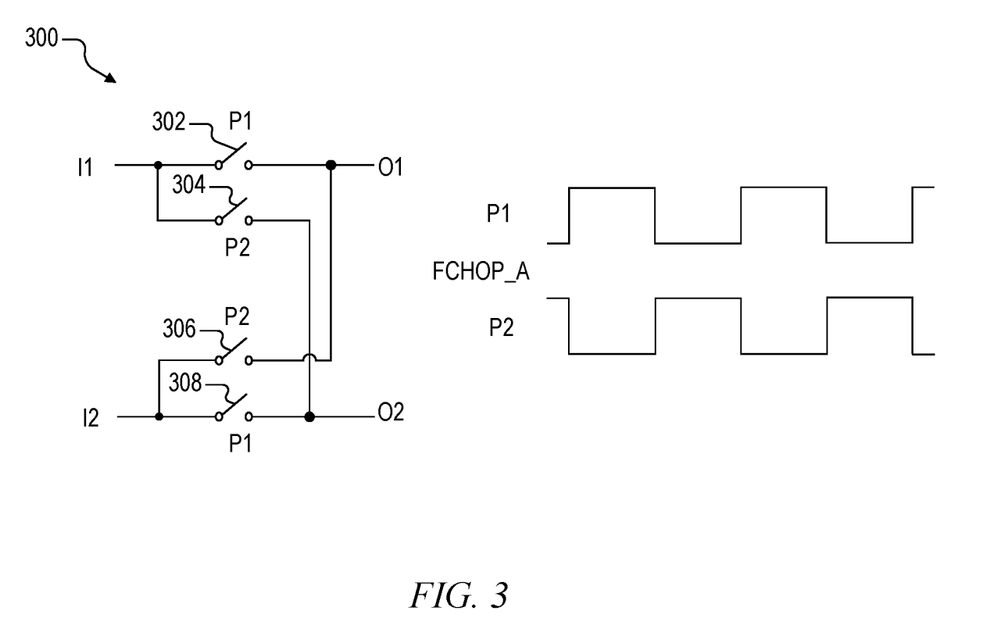
FIG. 3 is a schematic diagram of an analog chopper controlled by chop clock polarities of an analog chop clock and a corresponding timing diagram of the chop clock polarities according to one embodiment of the present disclosure.

FIG. 3 is a schematic diagram of an analog chopper 300 controlled by chop clock polarities P1 and P2 of FCHOP_A and a corresponding timing diagram of P1 and P2 according to one embodiment of the present disclosure. The analog chopper 300 may be used as either or both of the analog choppers 104 and 108. The analog chopper 300 includes as set of single-pole, single-throw (SPST) switches 302, 304, 306, and 308. Switch 302 has its terminals coupled between I1 and O1 and is controlled by P1, switch 304 has its terminals coupled between I1 and O2 and is controlled by P2, switch 306 has its terminals coupled between I2 and O1 and is controlled by P2, and switch 308 has its terminals coupled between I2 and O2 and is controlled by P1. Switches 302 and 308 are closed when P1 is high and opened when P1 is low, and switches 304 and 306 are closed when P2 is high and opened when P2 is low. P1 and P2 are both square-wave clock signals that are inverted versions of each other, so that P2 is low when P1 is high and vice-versa. In this manner, input I1 is coupled to output O1 and input I2 is coupled to output O2 during a first half cycle of FCHOP_A when P1 is high and P2 is low, and then the inputs and outputs are switched so that input I1 is coupled to output O2 and input I2 is coupled to output O1 during a second half cycle of FC FCHOP_A HOP when P1 is low and P2 is high. Operation repeats in this manner during successive cycles of FCHOP_A.

Referring back to FIG. 1, the input signal to the first stage (or to the loop filter 103) at the output of the adder 101 passes through the two sets of chopper switches 104 and 108, while the flicker noise of the amplifier 210 of the first integrator 106 passes only through the output chopper 110. This theoretically creates a frequency separation between the signal and noise, where the signal remains at baseband and the noise is upconverted to the chopping frequency. In practice, however, the chopping process is non-ideal due to implementation imperfections, such as physical imperfections of the switches 302, 304, 306, and 308 of each of the analog choppers 104 and 108, along with nonlinearities of, and timing differences between, P1 and P2, resulting in chopper process imperfections including time skew, finite rise and fall times, duty cycle error, bandwidth limitations, etc.

The non-ideal chopping process results in a fraction of the input signal effectively passing only through one set of chopper switches instead of both, so that the input signal is modulated with the chopping frequency. It has been observed that the information of the downfolded noise and tones at the sampling frequency is fully preserved and redundant in the raw output data of a modulator, including the digital signal V or V', so that it can be used to cancel the in-band noise and tones due to the non-ideal chopping. As further described herein, the downfolded noise and spurs due to the non-ideal chopping are replicated and cancelled by the chopping folding error replication and cancellation circuitry 102 by mixing the raw output data of the ΔΣ modulator 100 with the chopping frequency and by subtracting a chopping error with a gain factor from the ADC output data.

Figure 4:
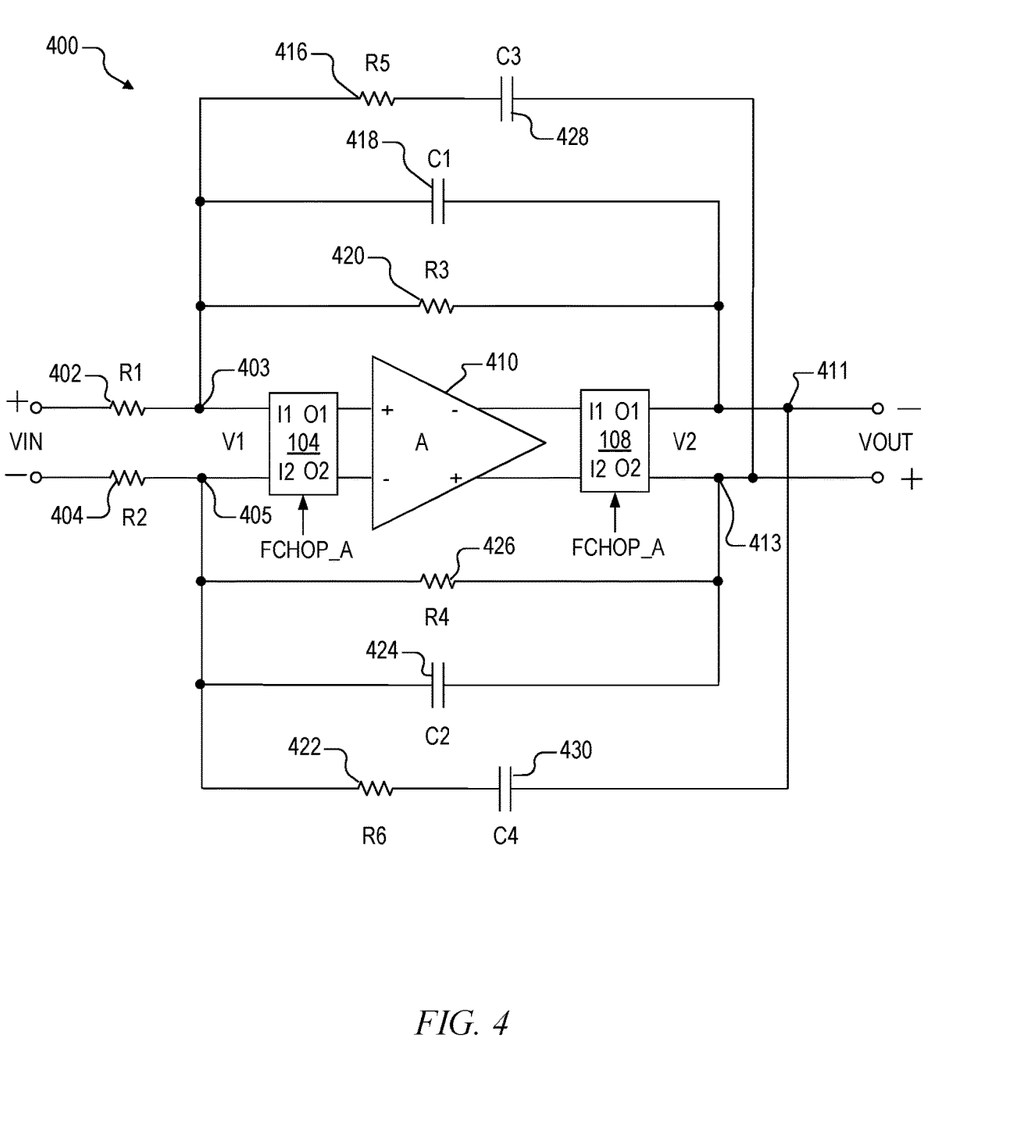
FIG. 4 is a schematic diagram of a loop filter implemented as a resonator coupled to the analog choppers of FIG. 1 according to another embodiment of the present disclosure.

FIG. 4 is a schematic diagram of a loop filter 400 implemented as a resonator coupled to the analog choppers 104 and 108 according to another embodiment of the present disclosure. The loop filter 400 is configured to collectively replace the adders 101 and 114 and the loop filter 103 including the integrators 106 and 110 and the paths 112 and 116. An input signal VIN, such as representing the input analog signal U, includes a positive polarity provided to a first end of a resistor 402 with a resistance R1 and includes a negative polarity provided to a first end of another resistor 404 with a resistance R2. The other end of the resistor 402 is coupled to a node 403 which is further coupled to a first input I1 of the analog chopper 104, to one end of a resistor 416 with a resistance R5, to one end of a capacitor 418 with a capacitance C1, and to one end of another resistor 420 with a resistance R3. The other end of the resistor 404 is coupled to a node 405 which is further coupled to a second input I2 of the analog chopper 104, to one end of a resistor 422 with a resistance R6, to one end of a capacitor 424 with a capacitance C2, and to one end of another resistor 426 with a resistance R4. The nodes 403 and 405 form the positive and negative polarities of a voltage V1.

The analog chopper 104 has first and second outputs O1 and O2 coupled to noninverting and inverting inputs, respectively, of an amplifier 410. The amplifier 410 has inverting and noninverting outputs coupled to first and second inputs I1 and I2, respectively, of the analog chopper 108. The analog chopper 108 has a first output O1 coupled to an output node 411 forming a negative polarity of an output voltage VOUT, in which node 411 is further coupled to the other ends of the capacitor 418 and the resistor 420 and to the other end of a capacitor 430 having a capacitance C4. The analog chopper 108 has a second output O2 coupled to another output node 413 forming a positive polarity of VOUT, in which node 413 is further coupled to the other ends of the capacitor 424 and the resistor 426 and to the other end of a capacitor 428 having a capacitance C3. The other end of the resistor 416 is coupled to the other end of the capacitor 428 and the other end of the resistor 422 is coupled to the other end of the capacitor 430. The polarities of VOUT are provided to corresponding polarity inputs (not shown) of the adder 118.

The configuration of the loop filter 400 coupled to the analog choppers 104 and 108 shown in FIG. 4 is exemplary only and many different resonator configurations are possible and contemplated. In one embodiment, R1=R2, R3=R4, R5=R6, C1=C2, and C3=C4, although different values may be used in alternative configurations. Normally without the analog choppers 104 and 108, node 403 is coupled to the noninverting input and node 405 is coupled to the inverting input of the amplifier 410, while the inverting and noninverting outputs of the amplifier 410 are provided to output nodes 411 and 413, respectively. Each of the analog choppers 104 and 108 may be configured in a similar manner as the analog chopper 300 for swapping its inputs and outputs at the rate of the chopping frequency of FCHOP_A as previously described.

Figure 5:
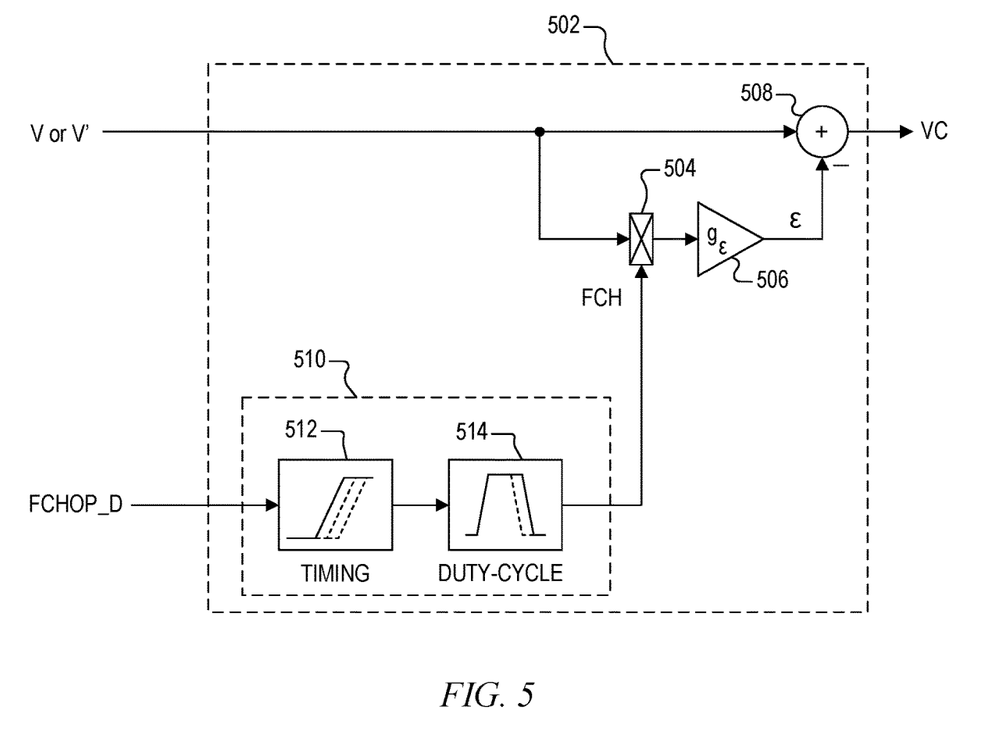
FIG. 5 is a simplified schematic and block diagram of chopping folding error replication and cancellation circuitry implemented according to one embodiment that may be used as the chopping folding error replication and cancellation circuitry of FIG. 1.

FIG. 5 is a simplified schematic and block diagram of chopping folding error replication and cancellation circuitry 502 implemented according to one embodiment that may be used as the chopping folding error replication and cancellation circuitry 102. The V or V' signal is provided to a positive input of a digital adder 508 and to an input of a digital chopper 504. The digital chopper 504 has an output coupled to an input of a digital amplifier 506 with a gain factor $g_\varepsilon$, which has an output providing a chopping error $\varepsilon$ to a negative input of the digital adder 508. The digital adder 508 subtracts the chopping error $\varepsilon$ from the V or V' signal to provide the corrected digital signal VC. The chopping folding error replication and cancellation circuitry 502 may include chopper clock correction and selection circuitry 510 that provides a chop clock signal FCH to clock the digital chopper 504. The chopper clock correction and selection circuitry 510 includes timing correction circuitry 512 and duty cycle correction circuitry 514. A digital version of the chop clock signal having the same chopping frequency, shown as FCHOP_D, is provided to an input of the timing correction circuitry 512, which has an output coupled to an input of the duty cycle correction circuitry 514. The duty cycle correction circuitry 514 has an output providing FCH to the digital chopper 504.

In an alternative embodiment, the chopper clock correction and selection circuitry 510 may be omitted or otherwise bypassed in which FCHOP_D is provided directly to the clock input of the digital chopper 504. To achieve an optimized cancellation result, the timing and duty cycle of the analog chopper clock FCHOP_A should be accurately replicated on the digital chopper clock FCHOP_D. The timing correction circuitry 512 may be used to adjust timing and the duty cycle correction circuitry 514 may be used to adjust duty cycle to optimize the mixing performed by the digital chopper 504 to replicate the chopping folding error.

As previously described, the information of the downfolded noise and tones at the sampling frequency FS is preserved and redundant in the raw output data contained in the digital signal V or V'. In this manner, this information is replicated and used to cancel the in-band noise and tones due to the non-ideal chopping. In particular, the downfolded noise and spurs due to the non-ideal chopping is replicated by mixing the V or V' output signal with the chopping frequency, performed by the digital chopper 404, amplifying chopped output data at the output of the digital chopper 504 with gain factor $g_\varepsilon$ to develop the chopping error $\varepsilon$, and subtracting the chopping error $\varepsilon$ from V or V' to provide the corrected VC signal. The gain factor $g_\varepsilon$ may initially be estimated and then adjusted, such as during fabrication or during calibration, to determine a final gain factor value to minimize the chopping error.

Figure 6:
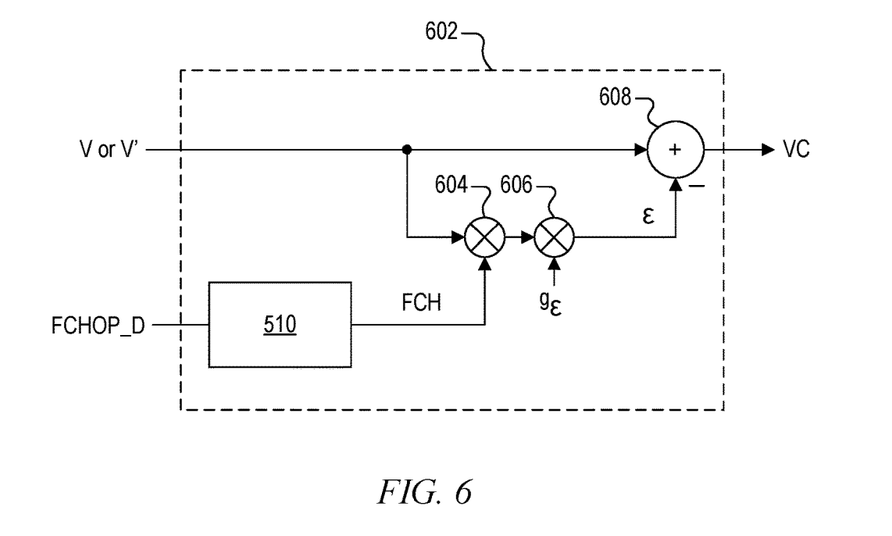
FIG. 6 is a simplified schematic and block diagram of chopping folding error replication and cancellation circuitry implemented according to another embodiment that may be used as the chopping folding error replication and cancellation circuitry of FIG. 1.

FIG. 6 is a simplified schematic and block diagram of chopping folding error replication and cancellation circuitry 602 implemented according to another embodiment that may be used as the chopping folding error replication and cancellation circuitry 102. The V or V' signal is provided to a positive input of a digital adder 608 and to an input of a digital multiplier 604. The digital multiplier 604 has an output coupled to an input of another digital multiplier 606, which has an output developing a chopping error $\varepsilon$ provided to a negative input of the digital adder 608. The digital adder 608 subtracts the chopping error $\varepsilon$ from the V or V' signal to provide the corrected digital signal VC. FCHOP_D is provided to an input of the chopper clock correction and selection circuitry 510, which provides FCH to another input of the digital multiplier 604. A gain factor $g_\varepsilon$ value is provided to another input of the digital multiplier 606.

The digital multiplier 604 may represent a physical implementation of the digital chopper 504, and the digital multiplier 606 may represent a physical implementation of the digital amplifier 506. The digital adder 608 operates in the same manner as the digital adder 508. In one embodiment, FCH toggles between 1 and −1 so that V or V' is multiplied by 1 and −1 in successive cycles of FCH. The alternating output is multiplied by the gain factor $g_\varepsilon$ by the digital multiplier 606 to provide the chopping error $\varepsilon$ used to convert V or V' to VC in a similar manner as previously described.

Figure 7:
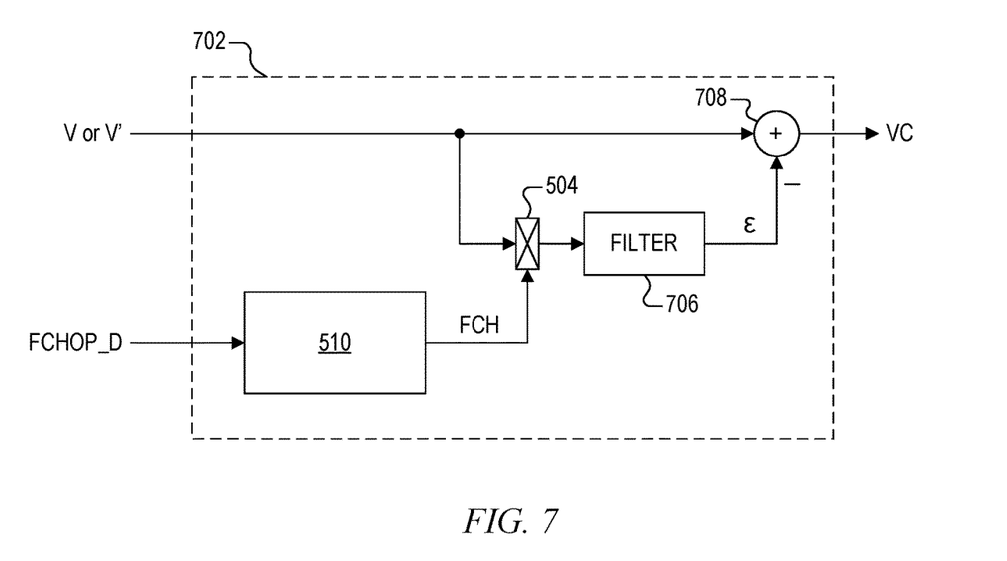
FIG. 7 is a simplified schematic and block diagram of chopping folding error replication and cancellation circuitry implemented according to yet another embodiment that may be used as the chopping folding error replication and cancellation circuitry of FIG. 1.

FIG. 7 is a simplified schematic and block diagram of chopping folding error replication and cancellation circuitry 702 implemented according to yet another embodiment that may be used as the chopping folding error replication and cancellation circuitry 102. The V or V' signal is provided to a positive input of a digital adder 708 and to an input of the digital chopper 504. The digital chopper 504 may be implemented by the digital multiplier 604 as previously described. The output of the digital chopper 504 is coupled to an input of a digital filter 706, having an output providing a chopping error ε which is provided to a negative input of the digital adder 708. The digital adder 708 operates in the same manner as the digital adder 508 by subtracting the chopping error ε from the V or V' signal to provide the corrected digital signal VC. FCHOP_D is provided to an input of the chopper clock correction and selection circuitry 510, which provides FCH to clock the digital chopper 504. Again, the chopper clock correction and selection circuitry 510 may be omitted or bypassed.

In one embodiment, the digital filter 706 is configured or otherwise programmed to model frequency dependent errors injected by the analog choppers 104 and 108 for frequency dependent compensation. The digital filter 706 may be implemented to provide more accurate error cancellation. In one embodiment, the digital filter 706 is implemented by a multitap finite-impulse response (FIR) filter. In another embodiment, the digital filter 706 is implemented by a multitap infinite-impulse response (IIR) filter.

Figure 8:
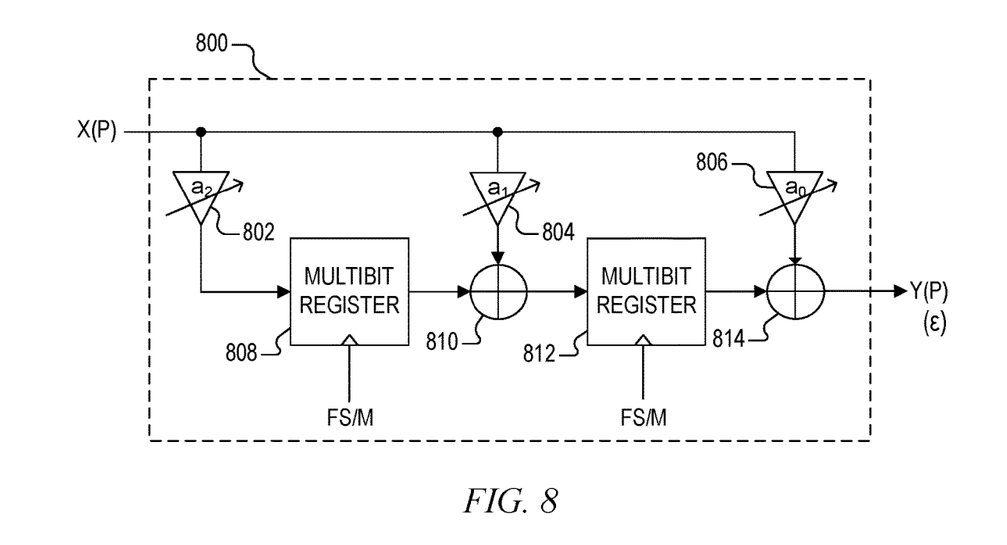
FIG. 8 is a schematic diagram of a digital 3-tap FIR filter which may be used as the digital filter of FIG. 7 according to one embodiment of the present disclosure.

FIG. 8 is a schematic diagram of a digital 3-tap FIR filter 800 which may be used as the digital filter 706 according to one embodiment of the present disclosure. A digital input signal X(P), such as provided from the output of the digital chopper 504, is provided to inputs of 3 digital amplifiers 802, 804, and 806. The digital amplifier 802 has an output coupled to an input of a multibit register 808 clocked by a frequency FS/M and having an output coupled to one input of a digital adder 810, where "M" is an integer greater than zero. The digital amplifier 804 has an output coupled to another input of the digital adder 810, which has an output coupled to an input of another multibit register 812 clocked by FS/M. The multibit register 812 has an output coupled to one input of another digital adder 814. The digital amplifier 806 has an output coupled to another input of the digital adder 814, which has an output providing a digital output Y(P) which may be used as the chopping error ε when used as the digital filter 706. The digital amplifiers 802, 804, and 806 have coefficients a2, a1, and a0, respectively, which may be adjustable or programmable. In one embodiment, the coefficients a0, a1, and a2 may be programmed to model frequency dependent errors injected by the analog choppers 104 and 108 for frequency dependent compensation. The digital filter 800 can run at a fraction of FS for M greater than 1 to provide a more power efficient implementation. The implementation of the digital filter 706 is not limited to a 3-tap FIR filter and can be parallelized to provide a power efficient implementation.

Figure 9:
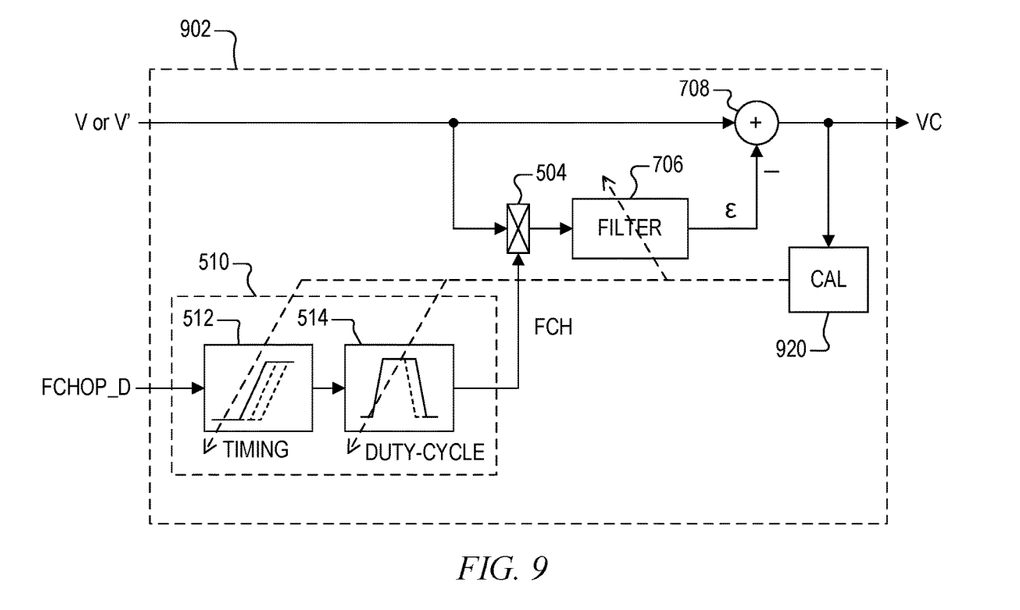
FIG. 9 is a simplified schematic and block diagram of chopping folding error replication and cancellation circuitry implemented according to still yet another embodiment that may be used as the chopping folding error replication and cancellation circuitry of FIG. 1.

FIG. 9 is a simplified schematic and block diagram of chopping folding error replication and cancellation circuitry 902 implemented according to still yet another embodiment that may be used as the chopping folding error replication and cancellation circuitry 102. The chopping folding error replication and cancellation circuitry 902 is substantially similar to the chopping folding error replication and cancellation circuitry 702 in which similar components assume identical reference numerals. As shown, the chopping folding error replication and cancellation circuitry 902 includes the adjust circuitry 510, the digital chopper 504, the digital filter 706 and the digital adder 708 coupled together to operate in substantially similar manner as previously described. In addition, calibration circuitry 920 is added having an input receiving VC and outputs used for calibrating the digital filter 706, the timing correction circuitry 512 and the duty cycle correction circuitry 514. The calibration circuitry 920 may perform calibration in a continuous manner or on a periodic basis as often as deemed necessary for a given configuration. In addition or in the alternative, calibration may be initiated in response to a predetermined or programmed event, such as a temperature change by a predetermined amount or when temperature reaches one or more predetermined temperature levels.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A delta-sigma modulator, comprising:
   a loop filter coupled to a quantizer having an output providing a digital signal;
   chopper circuitry coupled to the loop filter configured to chop analog signals of the loop filter at a chopping frequency;
   chopping folding error cancellation circuitry that is configured to replicate a chopping folding error of the chopper circuitry and to subtract the replicated chopping folding error from the digital signal to provide a corrected digital signal, the chopping folding error cancellation circuitry comprises:
      chopping error circuitry configured to chop at the chopping frequency having an input for receiving the digital signal and having an output for providing the replicated chopping folding error of the chopper circuitry; and
      a digital adder that is configured to subtract the duplicate chopping folding error from the digital signal for providing the corrected digital signal; and
   calibration circuitry configured to calibrate the chopping error circuitry.

2. The delta-sigma modulator of claim 1, wherein the chopping error circuitry comprises:
   a digital chopper that is configured to chop the digital signal at the chopping frequency for providing a chopped digital signal; and a digital amplifier that is configured to amplify the chopped digital signal by a gain value for providing the replicated chopping folding error.

3. The delta-sigma modulator of claim 1, wherein the chopping error circuitry comprises:
a first digital multiplier that is configured to multiply the digital signal by a digital clock operating at the chopping frequency for providing the chopped digital signal; and
a second digital multiplier having a first input for receiving the chopped digital signal, having a second input receiving the gain value, and having an output providing the duplicate chopping folding error.

4. The delta-sigma modulator of claim 1, further comprising adjust circuitry that is configured to adjust a digital chop clock operative at the chopping frequency.

5. The delta-sigma modulator of claim 4, wherein the adjust circuitry comprises at least one of timing circuitry configured to adjust timing of the digital chop clock and duty cycle circuitry that is configured to adjust a duty cycle of the digital chop clock.

6. The delta-sigma modulator of claim 1, wherein the chopping error circuitry comprises:
a digital chopper that is configured to chop the digital signal at the chopping frequency for providing a chopped digital signal; and
a digital filter that is configured to filter the chopped digital signal for providing the duplicate chopping folding error.

7. The delta-sigma modulator of claim 6, wherein the digital filter comprises at either one of an infinite impulse response filter and a finite impulse response filter.

8. The delta-sigma modulator of claim 1, wherein the chopping error circuitry comprises a digital filter and wherein the calibration circuitry is configured to calibrate the digital filter.

9. The delta-sigma modulator of claim 1, further comprising timing circuitry that is configured to adjust timing of the chopping frequency and duty cycle circuitry that is configured to adjust a duty cycle of the chopping frequency, wherein the calibration circuitry is configured to calibrate the timing circuitry and the duty cycle circuitry.

10. The delta-sigma modulator of claim 1, further comprising a decimation filter that filters and decimates the digital signal provided to the chopping folding error cancellation circuitry.

11. A method, comprising:
converting an input signal with a delta-sigma modulator comprising a loop filter coupled to a quantizer having an output for providing a digital signal;
chopping analog signals of the loop filter at a chopping frequency;
replicating a chopping folding error generated by the chopping of the analog signals based on digitally chopping the digital signal at the chopping frequency, the replicating comprising:
chopping the digital signal at the chopping frequency and providing a chopped digital signal; and
amplifying the chopped digital signal by a gain value for providing the replicated chopping folding error; and
subtracting the replicated chopping folding error from the digital signal and providing a corrected digital signal.

12. The method of claim 11, wherein the amplifying comprises multiplying the chopped digital signal by a gain value for providing the replicated chopping folding error.

13. The method of claim 12, wherein the replicating comprises:
chopping the digital signal at the chopping frequency and providing a chopped digital signal; and
filtering the chopped digital signal for providing the replicated chopping folding error.

14. The method of claim 13, wherein the filtering comprises filtering using either one of an infinite impulse response filter and a finite impulse response filter.

15. The method of claim 11, further comprising adjusting timing of a digital chop clock used for chopping the digital signal.

16. The method of claim 11, further comprising adjusting a duty cycle of a digital chop clock used for chopping the digital signal.

17. The method of claim 11, further comprising calibrating circuitry used for the replicating.

18. A method, comprising:
converting an input signal with a delta-sigma modulator comprising a loop filter coupled to a quantizer having an output for providing a digital signal;
chopping analog signals of the loop filter at a chopping frequency;
replicating a chopping folding error generated by the chopping of the analog signals based on digitally chopping the digital signal at the chopping frequency;
calibrating circuitry used for the replicating; and
subtracting the replicated chopping folding error from the digital signal and providing a corrected digital signal.

19. The method of claim 18, wherein the amplifying comprises multiplying the chopped digital signal by a gain value for providing the replicated chopping folding error.

20. The method of claim 18, further comprising adjusting timing of a digital chop clock used for chopping the digital signal.

\* \* \* \* \*